United States Patent
Rahmani (10) Patent No.: US 12,306,222 B2
(45) Date of Patent: May 20, 2025

(54) CENTRALIZED ELECTRICAL PROTECTION METHODS, DEVICES AND SYSTEMS FOR MICROGRIDS

(71) Applicant: Schneider Electric Industries SAS, Rueil Malmaison (FR)

(72) Inventor: Mustapha Rahmani, Saint Martin d'Hères (FR)

(73) Assignee: Schneider Electric Industries SAS, Rueil-Malmaison (FR)

(*) Notice: Subject to any disclaimer, the term of this patent is extended or adjusted under 35 U.S.C. 154(b) by 178 days.

(21) Appl. No.: 17/552,538

(22) Filed: Dec. 16, 2021

(65) Prior Publication Data

US 2022/0196711 A1 Jun. 23, 2022

(30) Foreign Application Priority Data

Dec. 21, 2020 (EP) .................................... 20306647

(51) Int. Cl.
*G01R 19/25* (2006.01)
*G06N 20/00* (2019.01)

(52) U.S. Cl.
CPC ......... *G01R 19/2513* (2013.01); *G06N 20/00* (2019.01)

(58) Field of Classification Search
CPC ........................... G01R 19/2513; G06N 20/00
See application file for complete search history.

(56) References Cited

U.S. PATENT DOCUMENTS

| | | | | |
|---|---|---|---|---|
| 2012/0022713 A1* | 1/2012 | Deaver, Sr. | ............ | G05B 17/02 |
| | | | | 700/298 |
| 2017/0229857 A1* | 8/2017 | Kral | .......................... | H02J 3/38 |
| 2017/0373535 A1* | 12/2017 | Dam | ................ | H02J 13/00007 |
| 2019/0081476 A1 | 3/2019 | Konya et al. | | |

(Continued)

FOREIGN PATENT DOCUMENTS

| | | | | | |
|---|---|---|---|---|---|
| CN | 107069661 A | * | 8/2017 | | |
| CN | 109557398 | * | 4/2019 | ............. | G01R 31/00 |
| CN | 106786565 B | | 11/2019 | | |

OTHER PUBLICATIONS

"Generator (circuit theory)", Wikipedia, accessed via Wayback Machine, https://web.archive.org/web/20170105112344/https://en.wikipedia.org/wiki/Generator_(circuit_theory) (Year: 2017).*

(Continued)

*Primary Examiner* — Douglas Kay
(74) *Attorney, Agent, or Firm* — Troutman Pepper Locke LLP (57) ABSTRACT

A method for training a machine learning classifier system for an electrical fault detection system includes:
acquiring a digital representation of a target microgrid electrical distribution system comprising a plurality of electrical switchgear devices, power sources and loads,
simulating electrical faults under different operating conditions and/or at a plurality of locations in the digital representation of the target electrical distribution system,
determining the simulated electrical response of the electrical distribution system to each simulated electrical fault, and
generating classifier parameters by associating, by the classifier system, the determined simulated responses to the corresponding simulated electrical faults.

10 Claims, 6 Drawing Sheets

(56) References Cited

U.S. PATENT DOCUMENTS

2020/0292608 A1* 9/2020 Yan .................. H02J 13/00034
2020/0350762 A1 11/2020 Holzer et al.

OTHER PUBLICATIONS

Ma, Yiwei, and et al. "Short circuit fault emulation by shunt connected voltage source converter." In 2015 IEEE Energy Conversion Congress and Exposition (ECCE), pp. 2622-2628. IEEE, 2015 (Year: 2015).*

Zhang, Shuoting, and et al. "Development of a converter-based transmission line emulator with three-phase short-circuit fault emulation capability." IEEE Transactions on Power Electronics 33, No. 12 (2018): 10215-10228 (Year: 2018).*

Serban, Ioan, and Catalin Petrea Ion. "Microgrid control based on a grid-forming inverter operating as virtual synchronous generator with enhanced dynamic response capability." International Journal of Electrical Power & Energy Systems 89 (2017): 94-105 (Year: 2017).*

European Search Report and Search Opinion dated May 21, 2021 for corresponding European Patent Application No. 20306647.7, 8 pages.

\* cited by examiner

CENTRALIZED ELECTRICAL PROTECTION METHODS, DEVICES AND SYSTEMS FOR MICROGRIDS

TECHNICAL FIELD

The present disclosure relates to electrical protection methods, devices and systems for electrical distribution systems, such as microgrids.

BACKGROUND

Low voltage electrical power distribution systems, such as microgrids, are increasingly used in many applications.

As is known, microgrids are capable of accommodating distributed power generation sources, such as renewable energy sources. Microgrids are often used to power one or more electrical loads, in which the flow of power may be reversible, as is the case of electrical storage systems or electrical vehicles connected to an electrical recharging station. Microgrids are also capable of operating independently from a public electrical grid in a so-called islanding mode of operation.

As with many electrical distribution systems, microgrids need electrical protection devices, such as breakers or other switchgear devices, in order to detect and suppress dangerous electrical faults, such as short circuits. However, some specific features of microgrids pose many challenges when it comes to implementing effective electrical protection systems.

For example, decentralized electrical protection systems based on local protection devices, such as fuses or breakers, are not always capable of adequately dealing with short circuit faults in microgrids. One reason is that many microgrids often rely on inverter-based generators, i.e. power sources comprising power conversion circuits including power electronics switches. This is typically the case of direct current (DC) power sources, such as photovoltaic solar panels, or storage systems such as electrochemical batteries or hydrogen fuel cells.

An issue with inverter-based generators is that short circuit faults are hard to detect, because with such generators, short circuit currents have a lower amplitude than short circuits faults emanating from power sources such as diesel generators or from the utility grid. For example, the short circuit current (Icc) of a fault associated to inverter-based generators may be comprised between 1 and 2.5 times the amplitude of the nominal output current. By comparison, in a system based on diesel generators, the short circuit current is larger, for example up to 4 times the amplitude of the nominal output current, or more.

As a result, in many instances, local protection devices, such as fuses or breakers, which rely only on the measured current amplitude, will fail to detect and suppress short circuit faults emanating from inverter-based generators.

Additionally, classical decentralized protection systems based on relays, such as ANSI 67 and ANSI 51V systems, are traditionally designed for medium voltage distribution systems, and their use in low voltage systems would incur substantial economic costs. Furthermore, tuning such protection devices can be a very complex and lengthy process.

To alleviate these drawbacks, centralized protection schemes based on a central electronic controller overseeing and controlling multiple protection devices may be used instead. However, centralized protection systems may be difficult to implement due to the flexible nature of microgrids. For example, the central controller needs to be programmed using rules based on physical equations that may be difficult to derive for complex microgrids. These rules also require many variables and operational parameters, such as the direction in which currents are flowing, and are highly sensitive to the frequency behavior of the power sources during short circuits. Thus, programming and fine-tuning such rules can be a very complex and lengthy process.

SUMMARY

It is therefore desirable to provide systems, devices and methods for facilitating the configuration and improving the operation of electrical protection systems in electrical distribution systems such as microgrids.

According to an aspect of the invention, a method for training a machine learning classifier system for an electrical fault detection system comprises:
  acquiring a digital representation of a target microgrid electrical distribution system, electrical distribution system comprising a plurality of electrical protection devices, power sources and loads,
  simulating electrical faults under different operating conditions and/or at a plurality of locations in the digital representation of the target electrical distribution system,
  determining the simulated electrical response of the electrical distribution system to each simulated electrical fault,
  generating classifier parameters by associating, by the classifier system, the determined simulated responses to the corresponding simulated electrical faults.

In other optional embodiments, the invention may advantageously comprise one or more of the following technical features, considered alone or according to all possible technical combinations:

Building the digital representation of the target microgrid electrical distribution system comprises:
  acquiring a digital model of the target electrical distribution system,
  automatically identifying grid-forming electrical power sources in the acquired digital model of the target electrical distribution system,
  creating a simplified digital representation of the target electrical distribution system based on the acquired digital model, by replacing each grid-forming power sources identified in the acquired digital representation with a virtual power generator.

Electrical power sources other than grid-forming power sources are not included in the simplified digital representation of the target electrical distribution system.

The virtual generator is a three-phase alternating current voltage source connected in series with a three-phase short circuit resistance.

Simulating electrical faults under different operating conditions comprises choosing different operating parameters for the virtual generators, such as different frequencies or different voltage amplitude values.

Simulating electrical faults under different operating conditions comprises simulating different locations and types of short circuit faults, comprising at least: three phase short circuit faults, phase-phase short circuit faults, phase-neutral short circuit faults.

Determining the simulated electrical response to each simulated electrical fault comprises determining at least one of the following values for one or more of the electrical protection devices: the electrical current for each phase, the electrical voltage for each phase, the current flow direction for each phase.

The classifier system is a support vector machine, or a neural network, or a logistic regression algorithm.

According to another aspect, a method for identifying electrical faults in a microgrid electrical distribution system comprises:
measuring electrical parameters in the electrical distribution system, using sensors associated to electrical switchgear devices connected in the electrical distribution system,
by a trained machine learning classifier system,
acquiring the measured electrical parameters,
identifying an electrical fault and estimating the location of the electrical fault in the electrical distribution system, from the acquired electrical parameters,
identifying at least one electrical switchgear device associated to the identified location in the electrical distribution system to isolate the electrical fault, wherein the classifier system is parametrized with classifier parameters obtained with a training method as described above.

According to another aspect, the method further comprises sending a command signal to open the at least one identified electrical switchgear device.

According to another aspect, an electronic controller is configured to train a machine learning classifier system for an electrical fault detection system by:
acquiring a simplified digital representation of a target microgrid electrical distribution system, said electrical distribution system comprising a plurality of electrical switchgear devices, power sources and loads,
simulating electrical faults under different operating conditions and/or at a plurality of locations in the digital representation of the target electrical distribution system, determining the simulated electrical response of the electrical distribution system to each simulated electrical fault,
generating classifier parameters by associating, by the classifier system, the determined simulated responses to the corresponding simulated electrical faults.

According to another aspect, an electronic controller is configured to automatically identify electrical faults in a microgrid electrical distribution system, by:
measuring electrical parameters in the electrical distribution system, using sensors associated to the electrical switchgear devices, power sources and loads, by a trained machine learning classifier system implemented by the electronic controller:
acquiring the measured electrical parameters,
identifying an electrical fault and estimating the location of the electrical fault in the electrical distribution system, from the acquired electrical parameters,
identifying at least one electrical switchgear device associated to the identified location in the electrical distribution system to isolate the electrical fault,
wherein the classifier system is parametrized with classifier parameters determined with a training method as previously described.

According to another aspect, a microgrid electrical distribution system comprises one or more electrical protection devices and an electronic controller coupled to the electrical protection devices, wherein the electronic controller is configured to automatically identify electrical faults in the electrical distribution system by:
measuring electrical parameters in the electrical distribution system, using sensors associated to the electrical switchgear devices,
by a trained machine learning classifier system implemented by the electronic controller:
acquiring the measured electrical parameters,
identifying an electrical fault and estimating the location of the electrical fault in the electrical distribution system, from the acquired electrical parameters,
identifying at least one electrical switchgear device associated to the identified location in the electrical distribution system to isolate the electrical fault,
wherein the classifier system is parametrized with classifier parameters with a training method as described above.

BRIEF DESCRIPTION OF THE DRAWINGS

The invention will be further understood upon reading the following description, provided solely as a non-limiting example, and made in reference to the appended drawings, in which.

DETAILED DESCRIPTION OF SOME EMBODIMENTS

Figure 1:
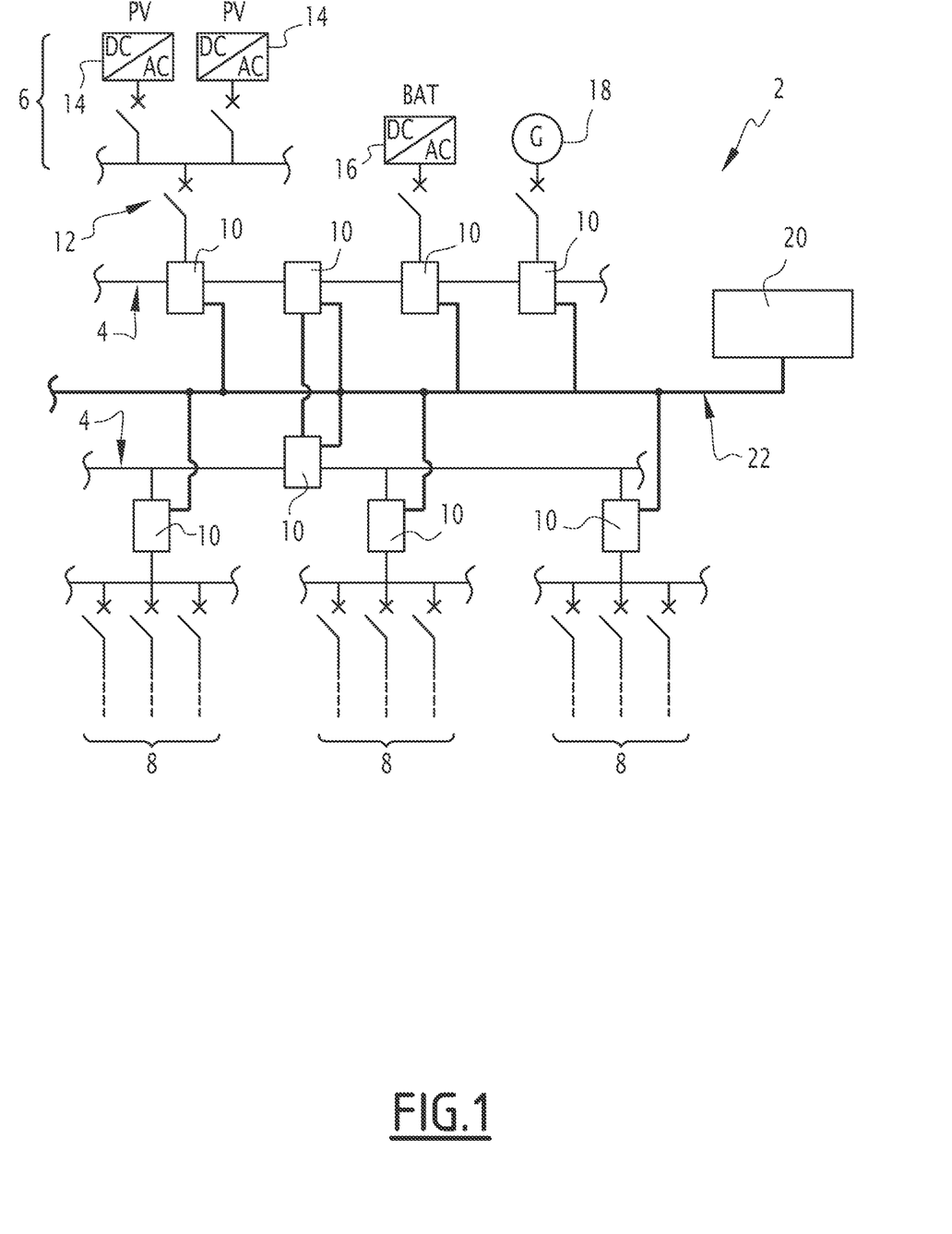
FIG. 1 is a simplified diagram of a microgrid comprising an electrical protection system according to embodiments of the invention.

An exemplary electrical distribution system 2 is illustrated on FIG. 1.

In preferred embodiments, the electrical distribution system 2 is a microgrid.

For example, the electrical distribution system 2 is a low-voltage (LV) distribution system, e.g. configured to distribute electrical power with voltages lower than 1500 volts.

In the illustrated example, the microgrid 2 comprises a plurality of electrical conductors 4, one or more electrical power sources 6, one or more electrical loads 8, and electrical switchgear devices 10 and 12. The power sources 6, the electrical loads 8 and the switchgear devices 10 and 12 are connected through electrical conductors 4.

In some examples, the power sources 6 may be connected in parallel to an electrical bus. Groups of electrical loads 8 and/or individual loads 8 may be connected in parallel to the electrical bus. Other configurations are nonetheless possible.

The switchgear devices 10 and 12 may be connected at specific locations of the microgrid 2 in order to be able to isolate key elements of the microgrid 2 and/or portions of the micro-grid 2.

For example, the microgrid 2 may comprise groups of power sources 6 and/or groups of loads 8. Each of these groups can be connected to the rest of the microgrid 2 through a switchgear device 10 or 12. Switchgear devices 10, 12 may also be used to selectively connect or isolate individual elements of the microgrid 2 and/or smaller portions of the microgrid 2. For example, switchgear devices 10, 12 can be associated to individual power sources 6 and electrical loads 8, in order to disconnect said sources or loads individually.

In the illustrated example, which is given for illustrative purposes and is not intended to limit the scope of the application to this specific embodiment, each individual power sources 6, and/or groups of power sources 6 can be coupled to a switchgear device 12, and can be disconnected from the rest of the microgrid 2 by this switchgear device 12. Similarly, individual loads 8, and/or groups of loads 8, can be disconnected by switchgear devices 12.

The switchgear devices 10, 12 may comprise a breaker, or a relay, or a contactor, or a switch, or any appropriate electrical switchgear.

In the illustrated example, some switchgear devices (identified by the reference 10) are connected to an electronic controller and may further comprise measurement devices, such as sensors, configured to collect data relating to the operation of the switchgear devices 10. Such data may include, for example, values of electrical operational variables, such as the amplitude of electrical currents, voltages, frequencies, current flow direction, or any appropriate parameter. Said switchgear devices 10 may also comprise electronic control circuitry and a communication interface.

Aside from these differences, the switchgear devices 10 may be similar to the switchgear devices 12 and may play a similar role to the switchgear devices 12.

Other embodiments are possible. For example, such measurement devices could be installed in the microgrid 2 independently form switchgear devices 10.

In some embodiments, the microgrid 2 is an alternating current (AC) electrical distribution system. Thus, the electrical conductors 4 may comprise separate phase conductors, and optionally a neutral conductor, for example for distributing three-phase electrical currents. However, in some other embodiments, the microgrid 2 could be a direct current (DC) electrical distribution system.

In practice, multiple power sources 6 can be connected to the microgrid 2, often in multiple locations, enabling distributed power generation. In preferred embodiments, at least some of the power sources 6 are renewable energy sources.

In many embodiments, at least some of the power sources 6 are DC power sources, which need to be connected to an electrical conversion circuit, such as an inverter, in order to deliver electrical power to the microgrid 2. Such power sources are named "invertor-based generators" in what follows.

In the illustrated example, one or more of the power sources 6 may be photovoltaic solar panels PV comprising, or associated to, DC/AC power conversion circuits 14.

The one or more power sources 16 could also comprise electrical storage devices, such as an electrochemical battery BAT, associated to a DC/AC conversion circuit 16. This example is not limiting and, in alternative embodiments, different energy storage systems could be used, such as hydrogen fuel cells, or a flywheel, or any appropriate system.

In addition, the power sources 6 may comprise one or more AC generators, such as gensets G (e.g., diesel generators), or more generally, any power generator based on rotating machines, such as wind turbines, or water turbines, or gas-fired turbines. Such generators do not require conversion circuits 14 or 16 to deliver power to the microgrid 2.

In many embodiments, the microgrid 2 can be connected to a public electrical grid, and, preferably, can be selectively connected to or disconnected from the electrical grid.

The microgrid 2 comprises an electronic controller 20 connected to the protection devices 10 through a local communication network 22, such as an industrial data bus.

For example, the controller 20 is a programmable logic controller (PLC).

The controller 20 may comprise electronic circuitry configured to perform various operations and may include a processor and a memory device (or any suitable non-transitory computer readable data storage media). The memory device has program instructions or computer code stored therein for automatically performing one or more of the functions described herein when said program instructions or computer code are executed by the processor.

For example, the processor is a generic processor, such as a microprocessor or a microcontroller, or a specific purpose processor such as a digital signal processor (DSP) or a graphical processor unit (GPU). In alternative embodiments, one or more functions of the controller 20 could be implemented by an application-specific integrated circuit (ASIC) or by a field-programmable gate array (FPGA), or by analog circuitry.

In some embodiments, the controller 20 may be in communication with a computer server through telecommunications links, such as a local area network, or the internet, or a cellular communications network, or any appropriate communications means.

The switchgear devices 10, 12 and the controller 20 are part of an electrical protection system and are configured to protect the microgrid from electrical faults, especially against short circuits. Preferably, they are configured to protect the microgrid 2 against one or more of the following faults (in AC microgrids): phase-phase short circuits faults (i.e., short circuits between two electrical phases), phase-neutral short circuits faults (i.e., short-circuit faults between phase and neutral), and three-phase short circuit faults.

However, it is to be noted that the embodiments disclosed herein do not necessarily preclude the microgrid 2 from comprising additional electrical protection devices for detecting and suppressing other types of electrical faults, such as differential faults.

Figure 2:
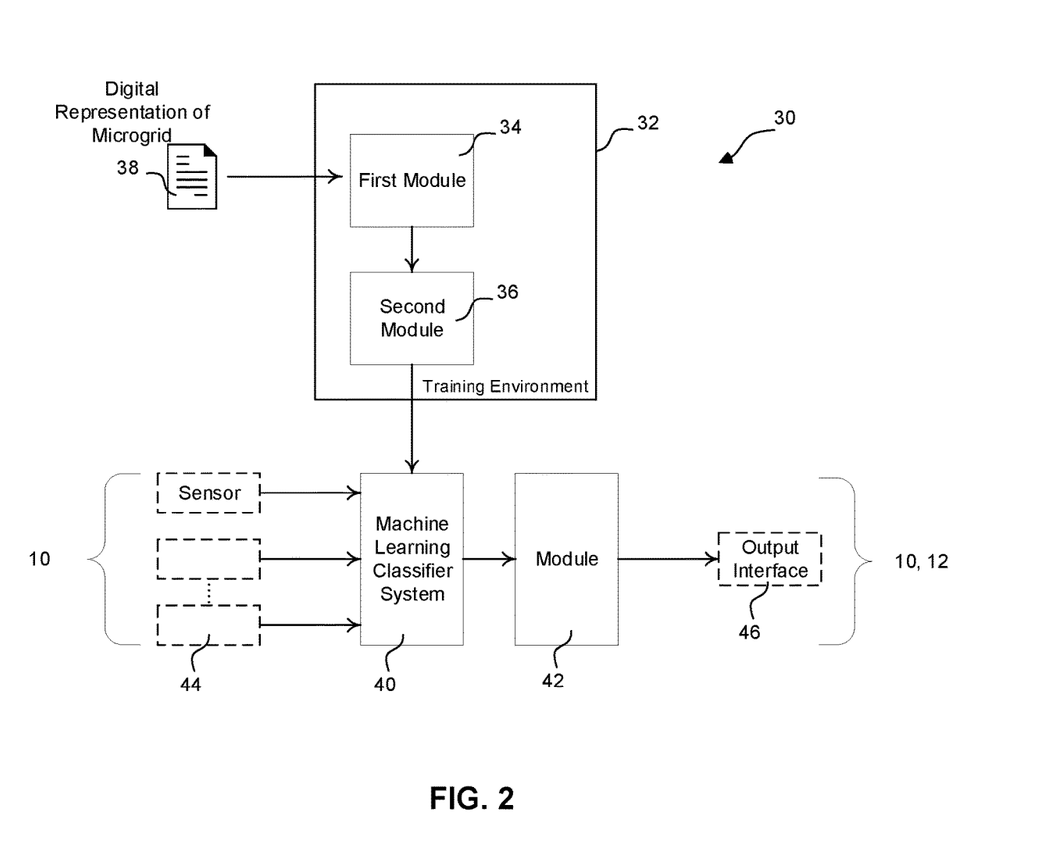
FIG. 2 is a simplified block diagram of an electrical protection system according to embodiments of the invention.

In reference to FIG. 2, there is illustrated a system 30 for detecting an electrical fault at least partially implemented by the controller 20.

The controller 20 is programmed to identify and estimate the location of short circuit electrical faults in the microgrid 2 using data measured by the switchgear devices 10 or by any appropriate measurement device (and/or data calculated from the data measured by the protection devices 10 or by said measurement devices).

To that end, in many embodiments, the controller 20 comprises:
- a machine learning classifier system 40 trained to identify and locate an electrical fault in the microgrid 2,
- a module 42 for identifying at least one switchgear device 10, 12 associated to the identified location,
- an acquisition interface for acquiring electrical parameters measured by the sensors 44 associated to the electrical switchgear devices 10, 12,
- and, optionally, an output interface for sending a command signal to open the at least one identified electrical switchgear device 46.

The module 42 and the classifier system 40 may be implemented by program instructions or computer code executed by the processor of the controller 20.

The classifier system 40 may be a support vector machine, or a neural network, or a logistic regression algorithm, or any appropriate machine learning system.

In practice, the classifier system 40 can be characterized by a set of classifier parameter, such as coefficients of a matrix.

For example, the classifier system 40 is configured to receive, as input data, electrical parameters measured by the sensors 44 associated to the electrical switchgear devices 10.

Preferably, the input data comprises, for each corresponding switchgear device 10, 12 and for each electrical phase of said switchgear device 10, 12: the value of the electrical current, the RMS voltage, the current flow direction, or any appropriate parameter. Preferably, RMS values (root mean square) may be used for the electrical current or for eh electrical voltages.

For example, the input data is recorded in an input vector, the dimension of which being chosen equal to the number of switchgear device 10, 12 part of the protection system, each coefficient of the input vector comprising the relevant electrical parameters associated to the corresponding switchgear device 10, 12 (e.g., the input data may be concatenated).

Preferably, the classifier system 40 is configured to provide, as output data, an information indicating if an electrical fault (such as a short circuit) has occurred at a specific location, among a list of predefined locations in the microgrid 2. These locations may be chosen where faults are likely to occur.

For example, the predefined locations may be associated to switchgear device 10, 12, or to other elements of the microgrid 2. The output data may comprise labels associated to each predefined location, or fault probability scores associated to each predefined location, indicating whether an electrical fault has been identified at the corresponding location.

For example, the output data may be recorded as an output vector, the dimension of which being equal to the number of predefined locations.

Each coefficient of the output vector may comprise a numerical value, such as a probability score. According to a possible convention, each coefficient may be a decimal number comprised between 0 and 1. For example, if one of the output values has a value higher than all the other output values, then the electrical fault is considered to have occurred at the location associated to the higher output value.

For example, the classifier system 40 may be configured to consider each fault location as a class that needs to be detected. Thus, each fault location is labeled and the output of the classifier system 40 is representative of the class label corresponding to the identified fault location.

In an exemplary embodiment, the classifier system 40 is based on a neural network classifier comprising an input layer, an output layer and at least one hidden layer connected between the input layer and the output layer, each layer comprising a plurality of nodes. The input layer receives the input data and can be modeled as an input vector, for example noted $X=(x_1 x_2 \ldots x_n)^T$.

The input vector may be constructed by concatenating the data provided by each switchgear device 10 (or by the relevant measuring devices). In practice, the dimension of the input vector is equal to $n_B \times n_F$ where $n_B$ is the number of switchgear devices 10 (or measuring devices) and $n_F$ is the number of features (e.g., the number of electrical parameters transmitted by each switchgear device 10 as input data).

For example, the number of features $n_F$ may be equal to 3 if only the current values for each phase are used as input data.

The action of the neural network on the input data vector can be modelled by the following set of equations $$a_{(1)} = x$$

$$x^{(2)} = g(z^{(2)}),$$

$$Y = a^{(3)} = g(z^{(3)}),$$

where Y is the output vector containing the output values, $a^{(2)}$ is a vector having coefficients $a_i^{(2)}$ are associated to the nodes of the hidden layer, $a_i^{(3)}$ is a having coefficients associated to the nodes of the output layer, $g(\cdot)$ is the sigmoid function defined by the formula $g(z)=1/(1+\exp(-z))$, $z^{(2)} = \Theta^{(1)} a^{(1)}$ and $z^{(3)} = \Theta^{(2)} a^{(2)}$, and $\Theta^{(1)}$ and $\Theta^{(2)}$ are parameter matrices.

Other embodiments are nonetheless possible, and may vary depending on the type of classifier system 40.

An advantage of using a classifier the embodiments disclosed herein is that the centralized protection system based on the main controller 20 can be configured automatically, with minimal human intervention, while still providing a reliable protection against electrical faults.

According to embodiments of the invention, the classifier system 40 is trained on a digital representation (e.g., a digital twin) of the microgrid 2, and preferably on a simplified digital representation of the microgrid, as will be explained in greater detail in what follows.

For example, a training environment 32 comprises:
- a first module 34 for acquiring a digital model of the microgrid 2 or building a simplified digital representation of the microgrid 2,
- a second module 36 configured to determine classifier parameters by:
  - simulating electrical faults under different operating conditions and/or at a plurality of locations in the simplified digital representation of the microgrid 2,
  - determining a simulated electrical response of the electrical distribution system (or more precisely, a simulated response of the digital model of the electrical distribution system) to each simulated electrical fault,
  - generating classifier parameters by associating the determined simulated responses to the corresponding simulated electrical faults.

In some instances, generating classifier parameters may comprise learning the classifier parameters using labeled simulated responses of the corresponding simulated electrical faults.

The first module 34 and the second module 36 may be implemented by program instructions or computer code executed by a processor, for example on the controller 20, or on a computer server (preferably connected to the controller 20).

The training environment 32 can be a software environment and may be run on the controller 20, or on a computer server (preferably connected to the controller 20).

The training environment 32 is capable of simulating the operation of the microgrid based on the digital model of the microgrid provided as input, and based on known electrical laws and properties of the various devices of the microgrid. The training environment 32 may comprise electrical simulation software, such as Simulink® software, or any equivalent software.

In many embodiments, the digital representation of the microgrid 2 may comprise a list of power sources 6, electrical loads 8, switchgear device 10, 12, as well as a list of electrical connections 4 (e.g., as line impedances) between these elements, and eventually a list of properties of said elements, preferably in a computer readable form. In a non-limiting example, the acquired digital representation 38 may be a Simulink® model of the microgrid 2. A graphical representation of these elements may be represented as a single line diagram (SLD) of the microgrid 2.

The simplified digital representation of the microgrid 2 may be built from an acquired digital representation 38 (a digital model) of the microgrid 2.

Figure 3:
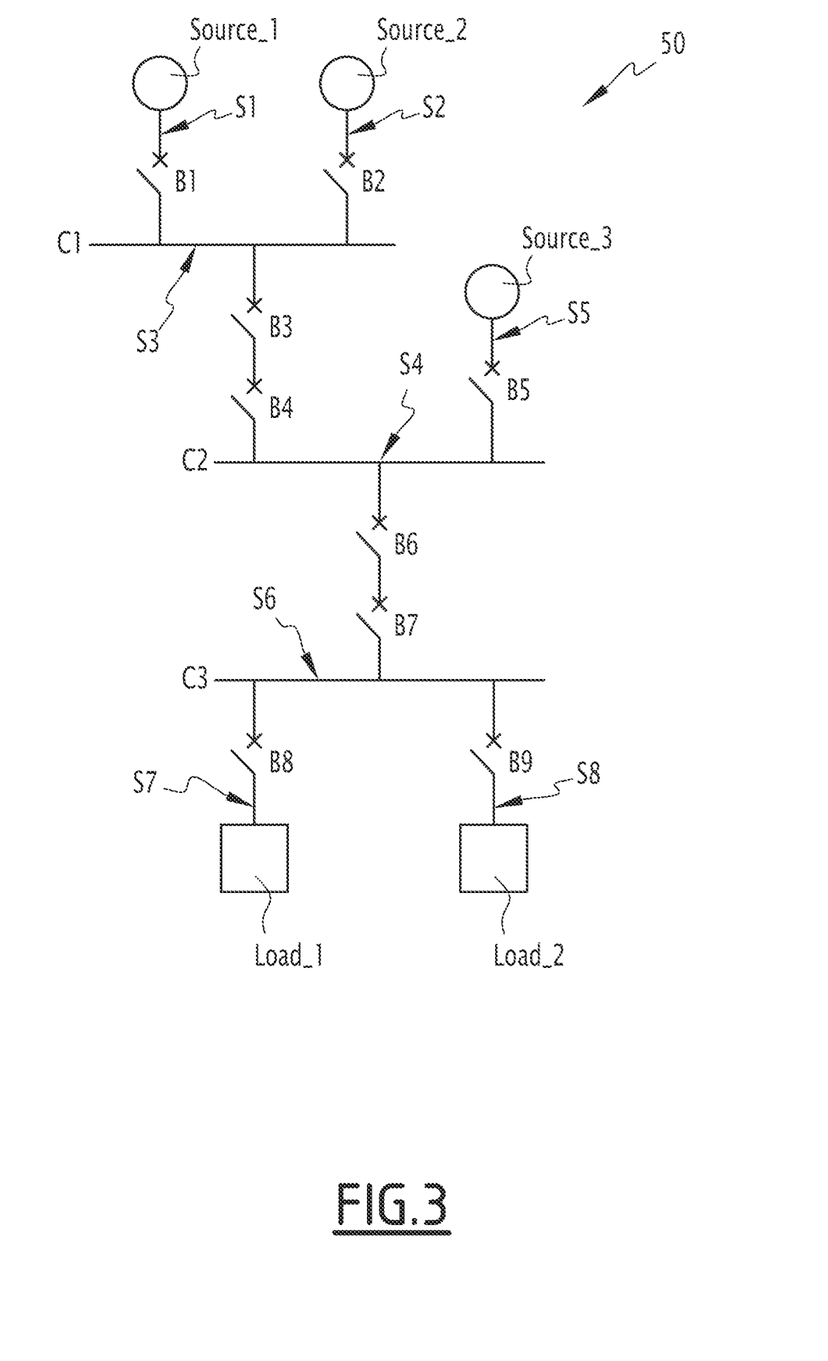
FIG. 3 is a diagram of an exemplary microgrid.

FIG. 3 illustrates an exemplary simplified representation 50 of a microgrid, depicted here as a single line electrical diagram for explanatory purposes.

In that specific example, given for illustrative purposes only and not intended to limit the scope of the application to this sole embodiment, the simplified representation 50 comprises:
- three voltage generators "Source_1", "Source_2", "Source_3",
- two electrical loads "Load_1", "Load_2",
- three electrical conductor buses C1, C2 and C3, and
- a plurality of switchgear devices, continuously numbered B1 through B9.

For example, the generators "Source_1" and "Source_2" are connected to the first bus C1, through protection devices B1 and B2. The first bus C1 is connected to the second bus C2 through two protection devices B3 and B4 connected in series. The generator "Source_3" is connected to the second bus C2 through a protection device B5. The second bus C2 is connected to the third bus C3 through two protection devices B6 and B7 connected in series. The loads "Load_1" and "Load_2" are connected to the third bus C3 through protection devices B8 and B9

A plurality of predefined fault locations, continuously numbered S1 through S8, are defined at specific locations of the microgrid 2 in the digital representation 50.

Other embodiments are nonetheless possible.

In preferred embodiments, the simplified representation of the microgrid 2 is built from the acquired digital model 38 by replacing the grid-forming power sources with virtual voltage generators.

In the meaning of the present specification, grid-forming power sources are electrical power sources connected to the microgrid and configured so as to generate and maintain a specified voltage and frequency during operation of the microgrid 2. For example, inverter-based sources are grid-forming power sources.

Preferably, electrical power sources found in the digital model 38 but which are not grid-forming power sources are not included in the simplified digital representation.

In practice, only the grid-forming power sources are relevant for modeling short circuit faults, because they generate a short circuit current (Icc) of constant amplitude during a fixed length of time (which may depend on the type of power source). Removing irrelevant power sources from the digital model reduces the simulation time required to simulate different situations and scenarios during the training phase.

Thus, the classifier system 40 can be trained more quickly and without requiring as much computational resources.

Figure 4:
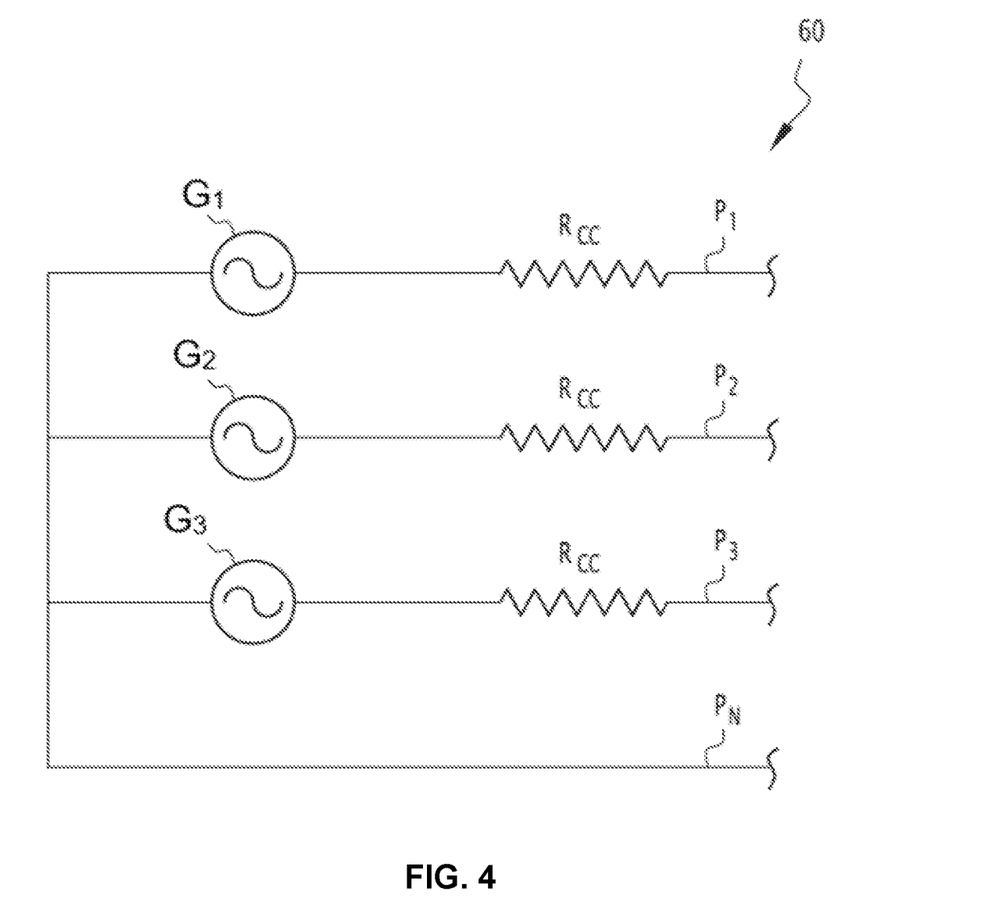
FIG. 4 is an electrical diagram of a generator.

In preferred embodiments, as shown in FIG. 4, the virtual generator 60 is a three-phase alternating current voltage source connected in series with a three-phase short circuit resistance Rcc.

In the illustrated example, for a three-phase AC system with a neutral line $P_N$, each phase $P_1$, $P_2$, $P_3$ respectively comprises a virtual AC voltage generator $G_1$, $G_2$ and $G_3$ connected in series with a short circuit resistance Rcc.

The voltage signals generated by generators $G_1$, $G_2$ and $G_3$ have the same voltage amplitude "E" and the same frequency "f" and may have a phase difference equal to $2*\pi/3$.

For example, the voltage signal generated by the generators $G_1$, $G_2$ and $G_3$ as a function of time "t" may be given by the following formulas, where sin( ) is the sine function:

$$G_1(t)=E\cdot\sin(2\pi\cdot f\cdot t)$$

$$G_2(t)=E\cdot\sin(2\pi\cdot f\cdot t-2\pi/3)$$

$$G_3(t)=E\cdot\sin(2\pi\cdot f\cdot t+2\pi/3).$$

Figure 5:
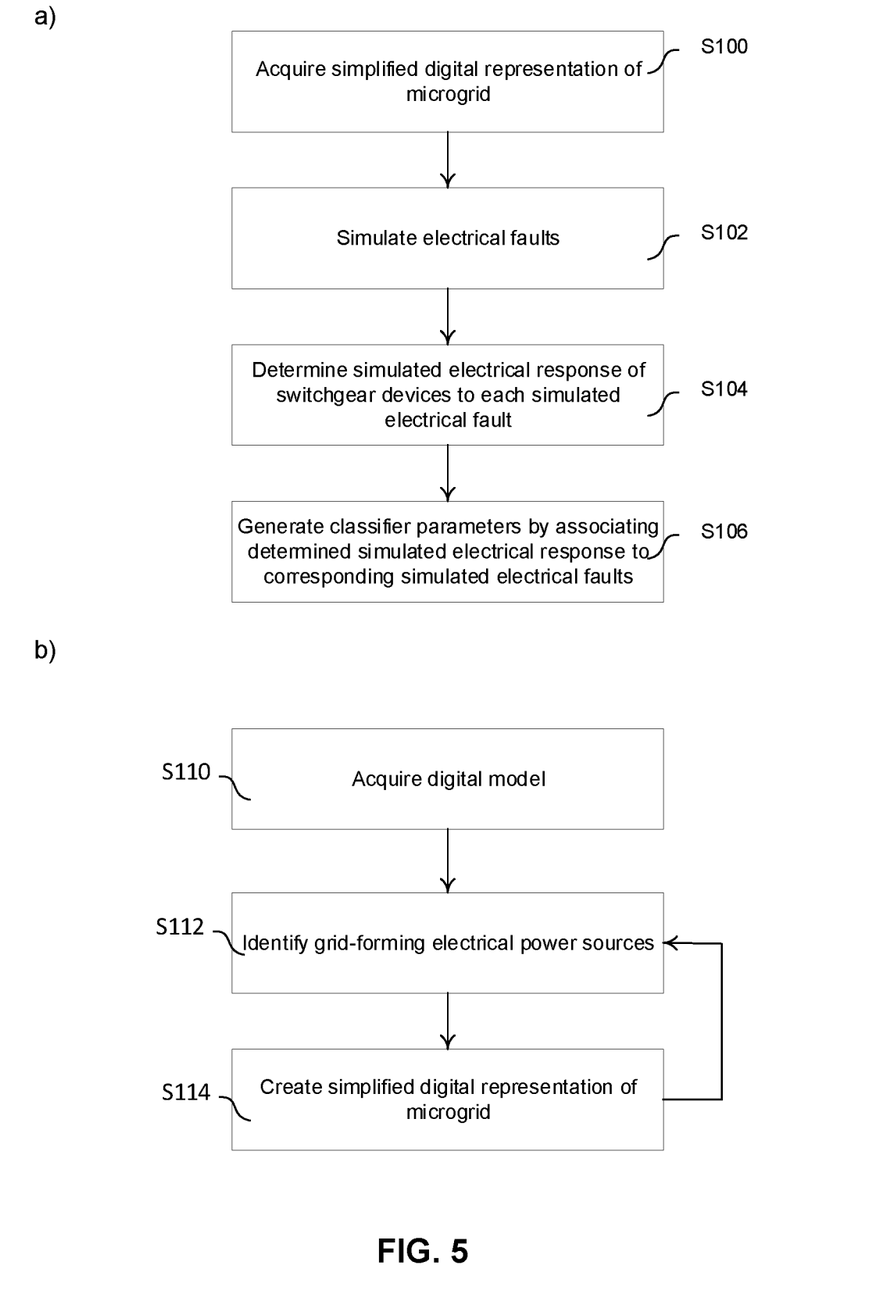
FIG. 5 is a flow chart depicting an exemplary method for training a machine learning classifier of the electrical protection system of FIG. 2.

The insert b) of FIG. 5 shows an exemplary method for building a simplified digital representation of the microgrid 2.

At block S110, the first module 34 acquires a digital model 38 of the target electrical distribution system.

At block S112, the first modules 34 identifies grid-forming electrical power sources in the acquired digital model 38.

At block S114, the first modules 34 creates a simplified digital representation of the microgrid 2 based on the acquired digital model 38, by replacing each grid-forming power sources identified in the acquired digital representation with a virtual power generator.

Step S114 may be repeated for each identified grid-forming electrical power source.

Other embodiments are nonetheless possible.

The insert a) of FIG. 5 now depicts an exemplary method for training the classifier system 40. This method may be executed by the controller 20, or by a computer server (preferably connected to the controller 20).

At block S100, a simplified digital representation of the microgrid 2 is automatically acquired. Preferably, said simplified digital representation has been generated using the method described above.

At block S102, the module 36 automatically simulates electrical faults under different operating conditions and/or at a plurality of locations in the simplified digital representation of the target electrical distribution system.

For example, all the different faults are simulated for each of the predefined locations S1-S8.

Preferably, simulating electrical faults under different operating conditions comprises simulating different types of short circuit faults, such as: three phase short circuit faults, phase-phase short circuit faults, phase-neutral short circuit faults.

In addition, simulating electrical faults under different operating conditions may also comprise choosing different operating parameters for the virtual generators, such as different frequencies (f) or different voltage amplitude values (E).

Preferably, for each predefined location, the module 36 simulates each of the different types of electrical faults, each time with different operating parameters (especially by varying the amplitude E and the frequency f for each simulated generator), in order to simulate and anticipate as many real life situations as possible. This increases the accuracy of the classifier system 40.

At block S104, for each simulated fault (e.g., for each operating condition and/or for each location and/or for each type of simulated fault), the simulated electrical response of the switchgear devices to each simulated electrical fault is automatically determined.

Thus, during this step S104, a plurality of simulated electrical parameters are acquired for switchgear devices and for each simulated fault.

These parameters correspond to the electrical parameters that would be measured or determined by the sensors 44 during operation of the microgrid 2.

For example, these parameters comprise the RMS current for each phase, the RMS voltage for each phase, the current flow direction for each phase, and so on.

At block S106, classifier parameters are generated by associating, by the classifier system, the determined simulated responses to the corresponding simulated electrical faults, preferably by using a learning method that uses the labeled simulated results. For example, "labelled" means that, for each simulation result, the relevant label is the label corresponding to the fault location.

For example, the classifier system 40 is provided with both the simulated electrical parameters acquired during step S104 (as input data), and the location of the simulated electrical fault (as expected output data), for each of the simulated fault.

The relevant classifier parameters may be calculated by finding the best values of a set of parameters minimizing a cost function associated to the classifier.

For example, in an exemplary neural network used as classifier system 40, the cost function to be minimized may be the following cost function:

$$J(\Theta) = -\frac{1}{m}\sum_{i=1}^{m}\sum_{k=1}^{K}[y_k^{(i)}\log(h_\Theta(x^{(i)}))_k + (1-y_k^{(i)})\log(1-h_\Theta(x^{(i)}))_k] + \frac{\lambda}{2m}\sum_{l=1}^{L-1}\sum_{i=1}^{m}\sum_{j=1}^{m+1}(\Theta_{j,i}^{(l)})^2$$

where "m" is the dimension (the size) of the training set, "K" is the number of classes (of predefined locations), "λ" l a tuning parameter, "$y_k$" is the location of the expected fault for the k-th sample, "L" is the size of the matrix $\Theta$ of classifier parameters, $h_e(x)$ is the output layer value for a specific input vector, and is equal to the function $g(z^{(3)})$ described above, and "sl" is the number of "activation units", or nodes, in layer "l" of the neural network. In that example, determining the relevant classifier parameters is achieved by finding the value of the parameter matrices $\Theta^{(1)}$ and $\Theta^{(2)}$. This illustrative example is not limiting and other embodiments are possible. Minimizing the cost function may be performed using common optimization algorithms.

At the end of step S106, the classifier has been "trained", i.e. a set of classifier parameters has been determined, and said parameters will allow the classifier system 40 to identify and locate electrical faults in the microgrid 2 when fed with data measured from the microgrid 2.

Figure 6:
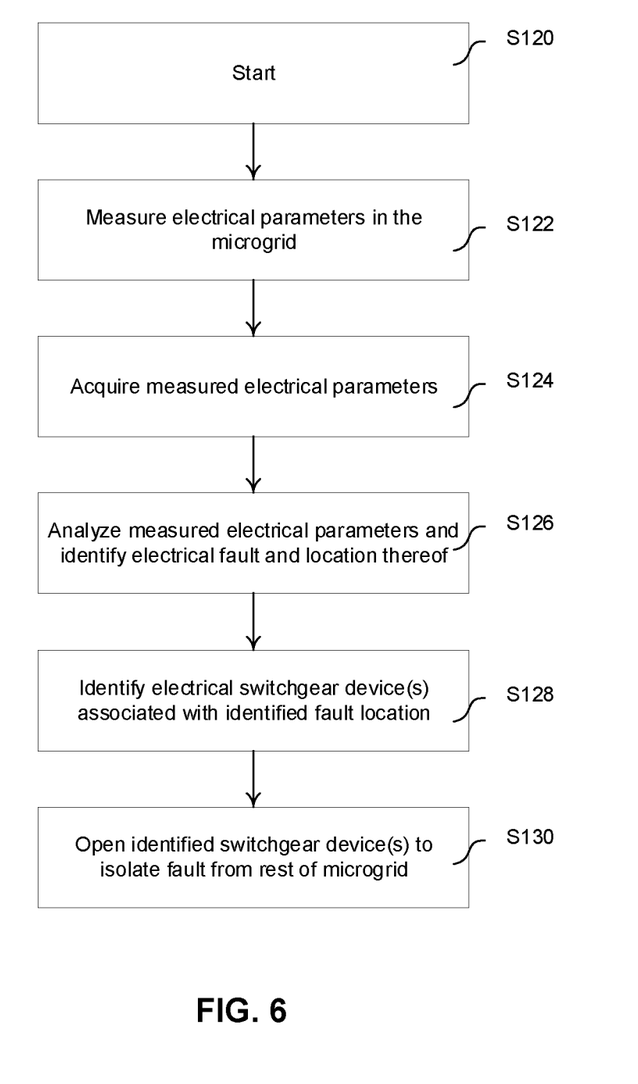
FIG. 6 is a flow chart depicting an exemplary method of operation implemented by the electrical protection system of FIG. 2.

An exemplary method of operation of the controller 20 is now described in reference to FIG. 6. For example, the program code stored in memory of the controller 20 causes the processor to execute the following steps.

The method begins at block S120.

For example, the controller 20 is started and the classifier system 40 is provided with classifier parameters calculated as above.

At block S122, electrical parameters in the electrical distribution grid are measured by the sensors 44 associated to the electrical switchgear devices. These measurements may be repeated continuously or regularly.

Data measured by the sensors 44, for example at each switchgear device, is acquired by the controller 20, for example over the communication links 22.

At block S124, the classifier system 40 acquires the electrical parameters measured by the sensors 44. This step may be repeated continuously or regularly.

At block S126, the classifier system 40 automatically analyzes the measured data.

If an electrical fault such as a short circuit fault has occurred, then during this step S126, the classifier system 40 identifies the electrical fault and estimates the location of the electrical fault.

For example, the output vector resulting from the minimization of the cost function described above may comprise a value indicating a high probability of occurrence of a fault at one of the predefined locations S1-S8.

The location of the fault is then acquired by the module 42.

At block S128, the module 42 automatically identifies at least one electrical switchgear devices associated to the identified fault location in the microgrid.

The aim of this step is to identify one or more switchgear devices which, when opened, would isolate the location of the identified fault from the rest of the microgrid 2, while causing minimal disruption to the rest of the microgrid 2.

For example, the identified switchgear devices may be a switchgear devices connected upstream of the identified fault location, or the switchgear devices located the closest to the identified fault location.

In some embodiments, if each of the predefined locations S1-S8 corresponds to a switchgear devices, then the target switchgear devices is automatically identified as the one corresponding to the predefined location at which the fault has been identified.

Alternatively, the module 42 may have to rely on additional information (such as electrical diagrams) in which the connections between elements of the microgrid 2 are described.

In the illustrated example of FIG. 5, if the fault is identified at the predefined location S4, then the switchgear devices B4, D5 and B6 have to be opened in order to isolate the fault.

At block S130, the controller 20 sends a command signal to open the identified switchgear device(s), in order to isolate the fault from the rest of the microgrid 2.

In other embodiments, the method steps described above could be executed in a different order. One or several method steps could be omitted or replaced by equivalent steps, or combined or dissociated into different method steps. The disclosed exemplary embodiment is not intended to be limiting and does not prevent other methods steps to be executed without departing from the scope of the claimed subject matter.

The embodiments and alternatives described above may be combined with each other in order to create new embodiments.

The invention claimed is:

1. A method for identifying electrical faults in a microgrid electrical distribution system, the method comprising:
    measuring electrical parameters in the electrical distribution system, using sensors associated to electrical switchgear devices connected in the electrical distribution system, by a trained machine learning classifier system,
acquiring the measured electrical parameters,
identifying an electrical fault and estimating the location of the electrical fault in the electrical distribution system, from the acquired electrical parameters,
identifying at least one electrical switchgear device associated to the identified location in the electrical distribution system to isolate the electrical fault, and
causing the at least one identified electrical switchgear device to open in response to identification of the electrical fault, and
wherein the classifier system is parametrized with classifier parameters obtained with a training method that comprises:
acquiring a digital representation of a target microgrid electrical distribution system that is connected to a public electrical grid system, said electrical distribution system comprising a plurality of electrical switchgear devices, power sources that are grid-forming power sources, power sources that are not grid-forming power sources, and loads, wherein the acquired digital representation of the target microgrid electrical distribution system is built by:
automatically identifying the grid-forming electrical power sources in the acquired digital representation, and
automatically creating a simplified digital representation of the microgrid electrical distribution system based on the acquired digital representation, by replacing each grid-forming power source identified in the acquired digital representation with a virtual power generator, wherein electrical power sources other than grid-forming power sources are not included in the simplified digital representation of the target electrical distribution system,
simulating electrical faults under different operating conditions and/or at a plurality of locations in the digital representation of the target electrical distribution system,
determining a simulated electrical response of the electrical distribution system to each simulated electrical fault, and
generating classifier parameters by associating, by the machine learning classifier system, the determined simulated electrical responses to the corresponding simulated electrical faults, wherein the generated classifier parameters enable the machine learning classifier system to identify and locate electrical faults in the target microgrid electrical distribution system when the machine learning classifier system acquires measured electrical parameters from the target microgrid electrical distribution system.

2. The method according to claim 1, wherein the virtual power generator is a three-phase alternating current voltage source connected in series with a three-phase short circuit resistance.

3. The method according to claim 2, wherein simulating electrical faults under different operating conditions comprises choosing different operating parameters for the virtual power generators.

4. The method according to claim 1, wherein simulating electrical faults under different operating conditions comprises simulating different locations and types of short circuit faults, comprising at least: three phase short circuit faults, phase-phase short circuit faults, and phase-neutral short circuit faults.

5. The method according to claim 1, wherein determining the simulated electrical response to each simulated electrical fault comprises determining at least one of the following values for one or more of the electrical switchgear devices: the RMS current for each phase, the RMS voltage for each phase, the current flow direction for each phase.

6. The method according to claim 1, wherein the classifier system is a support vector machine, or a neural network, or a logistic regression algorithm.

7. An electronic controller, configured to perform the training method recited in claim 1.

8. The method according to claim 3, wherein the different operating parameters comprise at least one of different frequencies or different voltage amplitude values.

9. An electronic controller configured to automatically identify electrical faults in a microgrid electrical distribution system, by:
measuring electrical parameters in the electrical distribution system, using sensors associated to the electrical switchgear devices connected in the electrical distribution system,
by a trained machine learning classifier system implemented by the electronic controller:
acquiring the measured electrical parameters,
identifying an electrical fault and estimating the location of the electrical fault in the electrical distribution system, from the acquired electrical parameters,
identifying at least one electrical switchgear device associated to the identified location in the electrical distribution system to isolate the electrical fault, and
causing the at least one identified electrical switchgear device to open in response to identification of the electrical fault,
wherein the classifier system is parametrized with classifier parameters determined with a training method that comprises:
acquiring a digital representation of a target microgrid electrical distribution system that is connected to a public electrical grid system, said electrical distribution system comprising a plurality of electrical switchgear devices, power sources that are grid-forming power sources, power sources that are not grid-forming power sources, and loads, wherein the acquired digital representation of the target microgrid electrical distribution system is built by:
automatically identifying the grid-forming electrical power sources in the acquired digital representation, and
automatically creating a simplified digital representation of the microgrid electrical distribution system based on the acquired digital representation, by replacing each grid-forming power source identified in the acquired digital representation with a virtual power generator, wherein electrical power sources other than grid-forming power sources are not included in the simplified digital representation of the target electrical distribution system,
simulating electrical faults under different operating conditions and/or at a plurality of locations in the digital representation of the target electrical distribution system, determining a simulated electrical response of the electrical distribution system to each simulated electrical fault, and generating classifier parameters by associating, by the machine learning classifier system, the determined simulated electrical responses to the corresponding simulated electrical faults, wherein the generated classifier parameters enable the machine learning classifier system to identify and locate electrical faults in the target microgrid electrical distribution system when the machine learning classifier system acquires measured electrical parameters from the target microgrid electrical distribution system.

10. A microgrid electrical distribution system, comprising one or more electrical switchgear devices and an electronic controller coupled to the electrical switchgear devices, wherein the electronic controller is according to claim 9.

\* \* \* \* \*